(12) United States Patent
Furutani

(10) Patent No.: US 7,155,197 B2
(45) Date of Patent: Dec. 26, 2006

(54) HIGH-FREQUENCY MODULE AND COMMUNICATION APPARATUS

(75) Inventor: Koji Furutani, Moriyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 582 days.

(21) Appl. No.: 10/682,994

(22) Filed: Oct. 9, 2003

(65) Prior Publication Data

US 2004/0080378 A1   Apr. 29, 2004

(30) Foreign Application Priority Data

Oct. 23, 2002 (JP) ............................. 2002-308473
Aug. 12, 2003 (JP) ............................. 2003-292035

(51) Int. Cl.
*H04B 1/08* (2006.01)

(52) U.S. Cl. ................ 455/349; 455/325; 333/133; 333/193

(58) Field of Classification Search ............... 455/349, 455/325, 23, 41.1, 556.1, 213, 286, 306, 455/307, 322, 339; 333/133, 132, 193
See application file for complete search history.

(56) References Cited

U.S. PATENT DOCUMENTS

| 4,942,400 | A | | 7/1990 | Tarzaiski et al. | |
|---|---|---|---|---|---|
| 5,065,275 | A | * | 11/1991 | Fujisaki et al. | 361/321.4 |
| 5,448,445 | A | * | 9/1995 | Yamate et al. | 361/304 |
| 6,437,654 | B1 | * | 8/2002 | Maruhashi et al. | 333/1.1 |

FOREIGN PATENT DOCUMENTS

| EP | 1 089 375 A2 | 4/2001 |
|---|---|---|
| EP | 1 235 357 A1 | 8/2002 |
| JP | 2001-320170 | 5/2000 |
| JP | 2002-158449 | 11/2000 |
| JP | 2001-185918 | 7/2001 |
| JP | 2001-352269 | 12/2001 |
| JP | 2002-118486 | 4/2002 |

OTHER PUBLICATIONS

Official Communication Issued in the corresponding Chinese Application No. 200310102868.4 and dispatched on Aug. 12, 2005 (with full English translation).
Official Communication Issued in the corresponding Korean Application No. 10-2003-0073801 and dispatched on Oct. 7, 2005 (with full English translation).
Official Communication issued in the corresponding European Application No. 03022912.4, mailed on Sep. 21, 2006.

* cited by examiner

*Primary Examiner*—Matthew Anderson
*Assistant Examiner*—Tan Trinh
(74) *Attorney, Agent, or Firm*—Keating & Bennett, LLP

(57) ABSTRACT

In a high-frequency module, intermediate ground electrodes are provided between a common ground electrode and upper-surface ground electrodes for mounting high-frequency components on an upper surface of a multilayer substrate. With regard to the number of via-hole conductors interconnecting ground electrodes, the number of via-hole conductors between the intermediate ground electrodes and the common ground electrode is larger than the number of via-hole conductors between the upper-surface ground electrodes and the intermediate ground electrodes.

16 Claims, 11 Drawing Sheets

FIG.2A
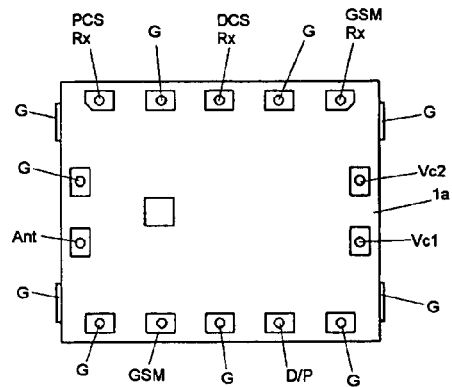
FIG.2B
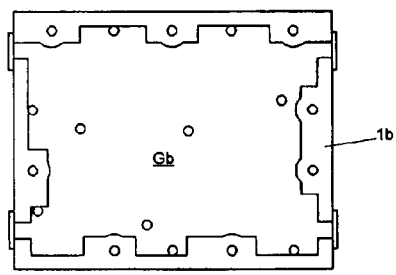
FIG.2C
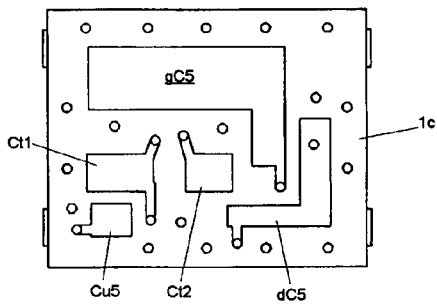
FIG.2D
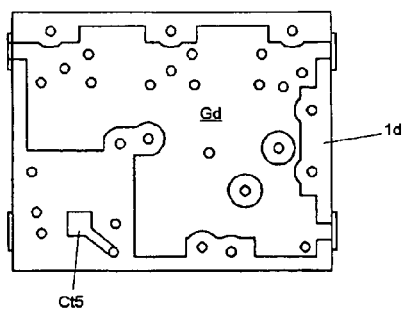
FIG.2E
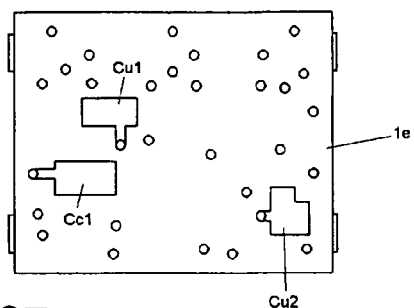
FIG.2F
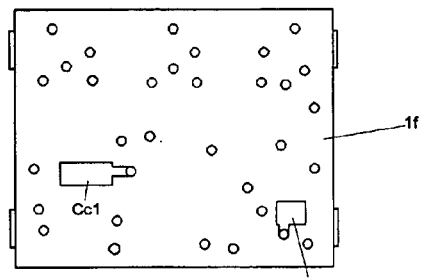
FIG.2G
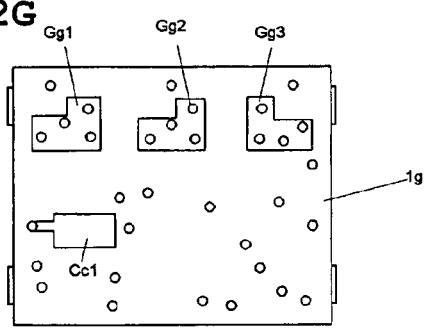
FIG.2H

HIGH-FREQUENCY MODULE AND COMMUNICATION APPARATUS

BACKGROUND OF THE INVENTION

1. Field of the Invention

The present invention relates to a high-frequency module in which high-frequency components such as chip filters are mounted on a multilayer substrate formed by laminating dielectric layers and electrode layers, and to a communication apparatus including such a high-frequency module.

2. Description of the Related Art

High-frequency modules of the type in which high-frequency components are mounted on a multilayer substrate provided with capacitors and inductors have been used in high-frequency circuit sections of, for example, portable communication terminals in order to reduce the number of parts and to enhance element density in high-frequency circuit sections of, for example, communication apparatuses. For example, high-frequency modules of this type are used in front-end sections of terminals provided in cellular phone systems to reduce the size and weight of the terminals.

The multilayer substrate includes a plurality of dielectric layers and electrode layers, and capacitors, inductors, transmission lines, etc. are formed by patterns of electrodes in the electrode layers. On a lower surface of the multilayer substrate (a surface for mounting on a mounting substrate (motherboard) in an electronic apparatus), a large number of external terminals is provided. Furthermore, on an upper surface of the multilayer substrate, upper-surface electrodes for mounting high-frequency components such as SAW filters are provided, for example, as disclosed in Japanese Unexamined Patent Application Publication No. 2002-118486 (FIG. 4).

Now, the construction of a high-frequency module including a multilayer substrate and a high-frequency component, disclosed in Japanese Unexamined Patent Application Publication No. 2002-118486, will be described with reference to FIGS. 11A and 11B.

FIG. 11A is an external perspective view of the high-frequency module, and FIG. 11B is an exploded perspective view of a main portion of the high-frequency module. A multilayer substrate 1 implemented by a lamination of dielectric layers and electrode layers has upper-surface electrodes and external terminals provided on a surface of the lamination. On a first principal surface of the multilayer substrate 1, high-frequency components 21 and 22 such as SAW filters are mounted.

FIG. 11B is an exploded perspective view showing two layers of the multilayer substrate 1 as extracted. In an uppermost dielectric layer 11, uppersurface electrodes for mounting the high-frequency components 21 and 22, including upper-surface ground electrodes Gq1 and Gq2, are formed. In a dielectric layer 15 near a lowermost layer, a common ground electrode Gd is formed. A large number of dielectric layers is provided between the uppermost dielectric layer 11 and the dielectric layer 15 near the lowermost layer, and the upper-surface ground electrodes Gq1 and Gq2 are directly connected to the common ground electrode Gd by way of via-hole conductors Vdq provided in the dielectric layers. The common ground electrode Gd is arranged to be a ground terminal among the large number of external terminals provided on the lower surface of the multilayer substrate 1.

However, in the high-frequency module according to the related art, for example, if the via-hole conductors are formed without adequately filling via holes with a conductive paste, connection of the high-frequency components 21 and 22 to the ground electrode Gd could become inadequate, possibly causing considerable deviation of electrical characteristics from designed characteristics.

Furthermore, when the number of dielectric layers is larger and the length of the via-hole conductors Vdq becomes longer, the inductance component of the via-hole conductors Vdq increases and grounding of the upper-surface ground electrodes Gq1 and Gq2 is deteriorated, causing inadequate grounding of the high-frequency components 21 and 22.

SUMMARY OF THE INVENTION

In order to overcome the problems described above, preferred embodiments of the present invention provide a high-frequency module in which high-frequency components mounted on a multilayer-substrate are grounded reliably and that exhibits favorable electrical characteristics, and a communication apparatus including such a novel high-frequency module.

According to a preferred embodiment of the present invention, a high-frequency module includes a multilayer substrate including a plurality of dielectric layers and a plurality of internal electrode layers laminated together, the multilayer substrate having at least one first ground electrode on a first principal surface thereof and having a second ground electrode on a second principal surface thereof or inside thereof, and a high-frequency component mounted on the first principal surface of the multilayer substrate, the high-frequency component having at least one ground terminal connected to the first ground electrode of the multilayer substrate, wherein at least one third ground electrode is provided inside the multilayer substrate, the third ground electrode being connected to the first ground electrode by way of a via-hole conductor and connected to the second ground electrode by way of a plurality of via-hole conductors.

A "high-frequency component" according to preferred embodiments of the present invention refers to a high-frequency component having a ground terminal, i.e., a terminal set to a ground potential so that the high-frequency component functions as it is supposed to. Thus, the high-frequency components are not limited to SAW filters, and may include, for example, IC devices and other suitable high-frequency devices.

According to another preferred embodiment of the present invention, a communication apparatus includes a high-frequency module according to the preferred embodiment of the present invention described above, the high-frequency module being provided in a front-end section, wherein the high-frequency component is a chip filter, and an LC filter is disposed inside the multilayer substrate.

According to the high-frequency module of preferred embodiments of the present invention, the first ground electrode and the second ground electrode are connected to each other by way of the third ground electrode disposed therebetween. Therefore, even if some via-hole conductors have problems of conduction among a plurality of via-hole conductors connecting the second ground electrode to the third ground electrode, conduction is maintained by other via-hole conductors. Accordingly, stable and highly reliable electrical characteristics are achieved.

Furthermore, the second ground electrode is connected to the third ground electrode at a low inductance. Accordingly, the high-frequency component mounted on the upper surface of the multilayer substrate exhibits adequate electrical characteristics.

The communication apparatus, including the front-end section implemented by the above-described high-frequency module, exhibits stable and favorable communication performance.

Other features, elements, characteristics and advantages of the present invention will become more apparent from the following detailed description of preferred embodiments thereof with reference to the attached drawings.

BRIEF DESCRIPTION OF THE DRAWINGS

FIGS. 2A to 2H are diagrams showing specific examples of electrode patterns provided in dielectric layers of a multilayer substrate according to a preferred embodiment of the present invention;

DETAILED DESCRIPTION OF PREFERRED EMBODIMENTS

The construction of a high-frequency module according to a preferred embodiment of the present invention will be described with reference to FIGS. 1A and 1B.

Figure 1A:
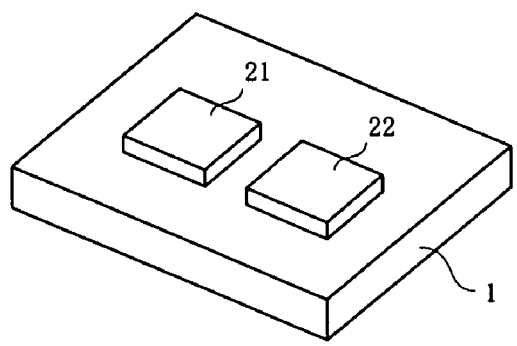
FIGS. 1A and 1B are an external perspective view and an exploded perspective view, respectively, of a high-frequency module according to a preferred embodiment of the present invention.
Figure 1B:
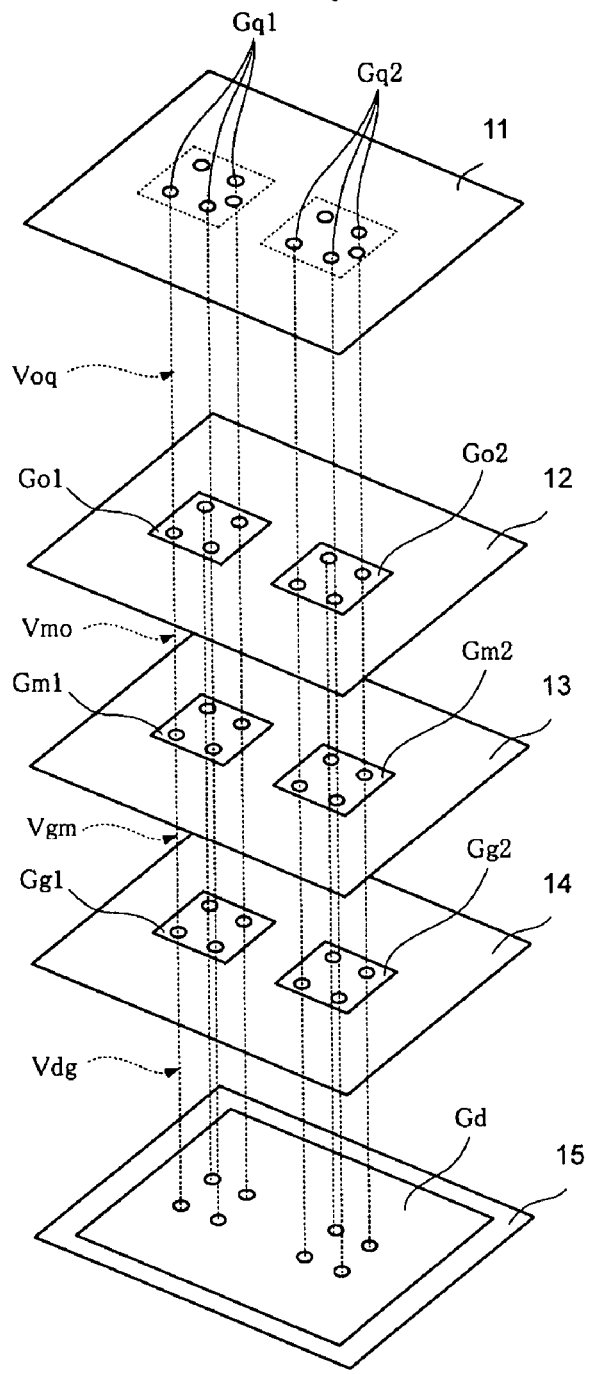
Figure 3A:
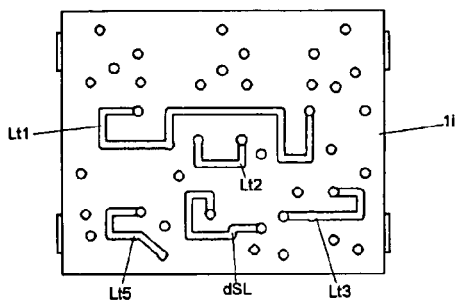
FIGS. 3A to 3G are diagrams showing specific examples of electrode patterns provided in dielectric layers of the multilayer substrate according to a preferred embodiment of the present invention.
Figure 3B:
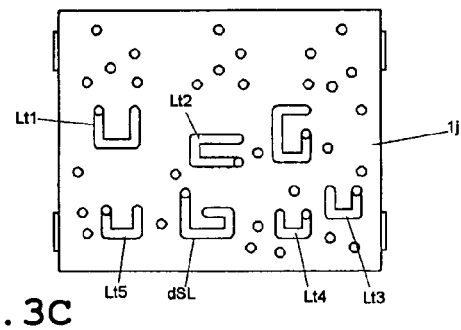
Figure 3C:
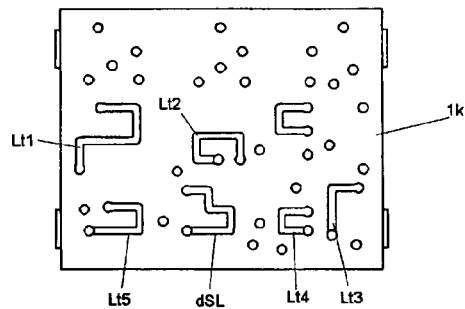
Figure 3D:
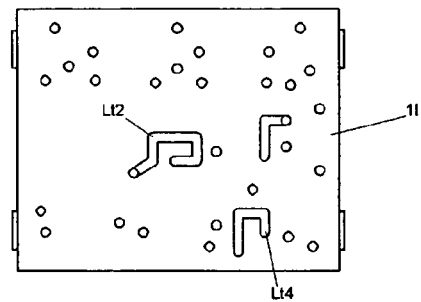
Figure 3E:
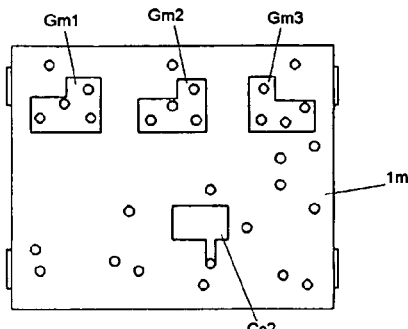
Figure 3F:
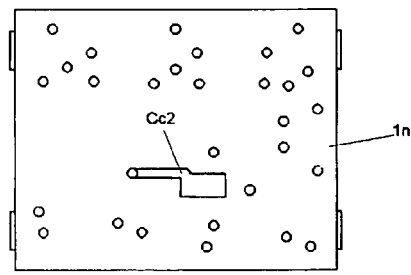
Figure 3G:
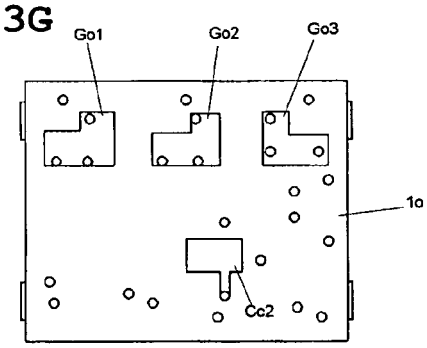

FIGS. 1A and 1B are diagrams showing the basic construction of the high-frequency module. More specifically, FIG. 1A is a perspective view of the high-frequency module, and FIG. 1B is an exploded perspective view of a main portion thereof.

The high-frequency module according to this preferred embodiment includes a multilayer substrate 1 implemented by a lamination of a plurality of dielectric layers 11, 12, 13, 14, and 15 and a plurality of internal electrodes Go1, Go2, Gm1, Gm2, Gg1, Gg2, and Gd, and high-frequency components 21 and 22 mounted on a first principal surface of the multilayer substrate 1. On the first principal surface of the multilayer substrate 1 (i.e., on a surface of the dielectric layer $1q$), first ground electrodes Gq1 connected to ground terminals of the high-frequency component 21 and first ground electrodes Gq2 connected to ground terminals of the high-frequency component 22 are provided. Furthermore, inside the multilayer substrate 1, a second ground electrode Gd commonly associated with the first ground electrodes Gq1 and Gq2 is provided on the lowermost dielectric layer 15. The second ground electrode Gd is connected, by way of via-hole conductors, to an external ground terminal provided on a second principal surface of the multilayer substrate 1.

The first ground electrodes Gq1 are connected to the second ground electrode Gd by way of via-hole conductors Voq, Vmo, and Vgm, and the third ground electrodes Go1, Gm1, and Gg1. Similarly, the first ground electrodes Gq2 are also connected to the common second ground electrode Gd by way of the via-hole conductors Voq, Vmo, and Vgm, and the third ground electrodes Go2, Gm2, and Gg2.

More specifically, the dielectric layers 14, 13, and 12 are provided as intermediate layers between the uppermost dielectric layer 11 and the lowermost dielectric layer 15. On the dielectric layers 14, 13, and 12, the third ground electrodes Gg1 and Gg2, Gm1 and Gm2, and Go1 and Go2 are preferably formed, respectively. The third ground electrodes Go1 and Go2 are connected to the first ground electrodes Gq1 and Gq2 by way of the via-hole conductors Voq, respectively. Furthermore, the ground electrodes Go1 and Go2 are connected to the third ground electrodes Gm1 and Gm2 by way of the via-hole conductors Vmo, respectively. Furthermore, the third ground electrodes Gm1 and Gm2 are connected to the third ground electrodes Gg1 and Gg2 by way of the via-hole conductors Vgm. Furthermore, the third ground electrodes Gg1 and Gg2 are connected to the common second ground electrode by way of the plurality of via-hole conductors Vdg.

In this example, the high-frequency components 21 and 22 each have three ground terminals. Accordingly, three ground electrodes Gq1 or Gq2 are provided on the first principal surface for each, and three via-hole conductors Voq are provided for each. As for the via-hole conductors Vmo and Vgm interconnecting third ground electrodes provided in a plurality of layers, four via-hole conductors are provided for each third ground electrode. Also, as for the via-hole conductors Vdg interconnecting the third ground electrodes Gg1 and Gg2 and the second ground electrode Gd, four via-hole conductors are preferably provided for each third ground electrode.

As described above, the third ground electrodes that define intermediate ground electrodes are provided in a plurality of layers for each of the high-frequency components 21 and 22, and the intermediate ground electrodes in each set is commonly grounded. Thus, even if a via hole is not adequately filled with a conductive paste, a common connection is recovered by an intermediate ground electrode. Accordingly, ultimate grounding to the second ground electrode Gd is achieved by a large number of via-hole conductors. For example, even if one of the plurality of via-hole conductors Vmo becomes nonconductive, grounding is ensured by the third ground electrodes Gm1 and Gm2. Thus, connection to the second ground electrode at a lower layer is reliably achieved.

Furthermore, since the third ground electrodes are connected to the second ground electrode Gd by way of a larger number of via-hole conductors than the number of ground terminals of the high-frequency components 21 and 22, the ground terminals of the high-frequency components are connected at low inductances to the second ground electrode that defines a common ground electrode. Thus, degradation in high-frequency characteristics due to inadequate grounding of the high-frequency components 21 and 22 is prevented.

Furthermore, since the second ground electrodes Gq1, Gq2, Gm1, Gm2, Go1, and Go2 are provided independently for the high-frequency components 21 and 22 mounted on an upper surface of the multilayer substrate 1, diffraction of high-frequency signals by way of the intermediate ground electrodes is prevented. For example, if the inductances between the third ground electrodes Go1 and Go2 and the second ground electrode Gd are larger than the inductances between the first ground electrodes Gq1 and Gq2 and the third ground electrodes Go1 and Go2 and if the third ground electrode Go1 and the third ground electrode Go2 form a continuous electrode pattern, ground leak currents of the high-frequency components 21 and 22 could be diffracted by way of the first ground electrode Gq1, the via-hole conductor Voq, and the third ground electrode Go1 and by way of the third ground electrode Go2, the via-hole conductor Voq, and the first ground electrode Gq2, causing a problem in electrical characteristics. Therefore, a third ground electrode is arranged so that L1>L2 will be satisfied, where L1 denotes an inductance component between a first ground electrode and a third ground electrode and L2 denotes an inductance component between the third ground electrode and a second ground electrode (an ideal ground electrode, usually a ground terminal of a high-frequency module). Thus, the above-described phenomenon that a ground current of one of the high-frequency modules flows into a ground electrode of the other high-frequency component by way of the common ground electrode is prevented. Therefore, in order to reliably prevent degradation in characteristics due to diffraction of a ground current, it is desired that L1 and L2 satisfy a relationship of L1>L2.

Now, an RF front-end module according to a preferred embodiment of the present invention will be described.

FIGS. 2A to 4B show specific examples of electrode patterns provided in dielectric layers of a multilayer substrate of the RF front-end module. The examples relate to a triple-band front end that supports Personal Communication Service (hereinafter simply referred to as "PCS") that uses the 1,900 MHz band, Digital Cellular System (hereinafter simply referred to as "DCS") that uses the 1,800 MHz band, and Global System for Mobile Communication (hereinafter simply referred to as "GSM") that uses the 900 MHz band.

Figure 4A:
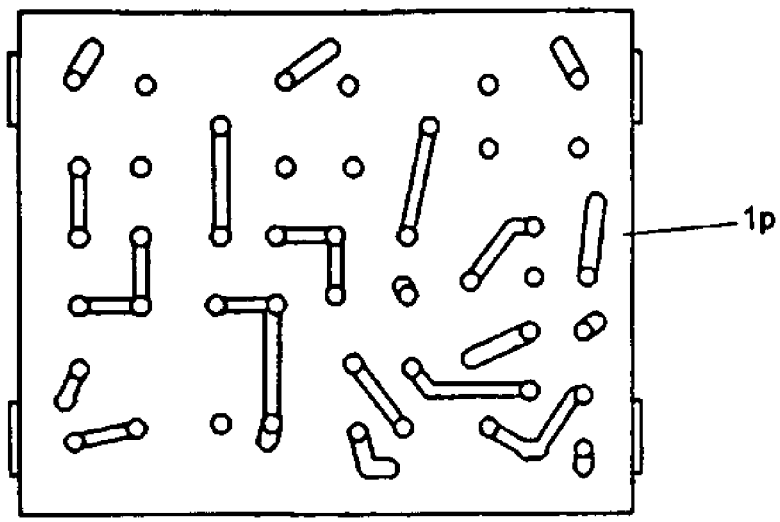
FIGS. 4A and 4B are diagrams showing specific examples of electrode patterns provided in dielectric layers of the multilayer substrate according to a preferred embodiment of the present invention.
Figure 4B:
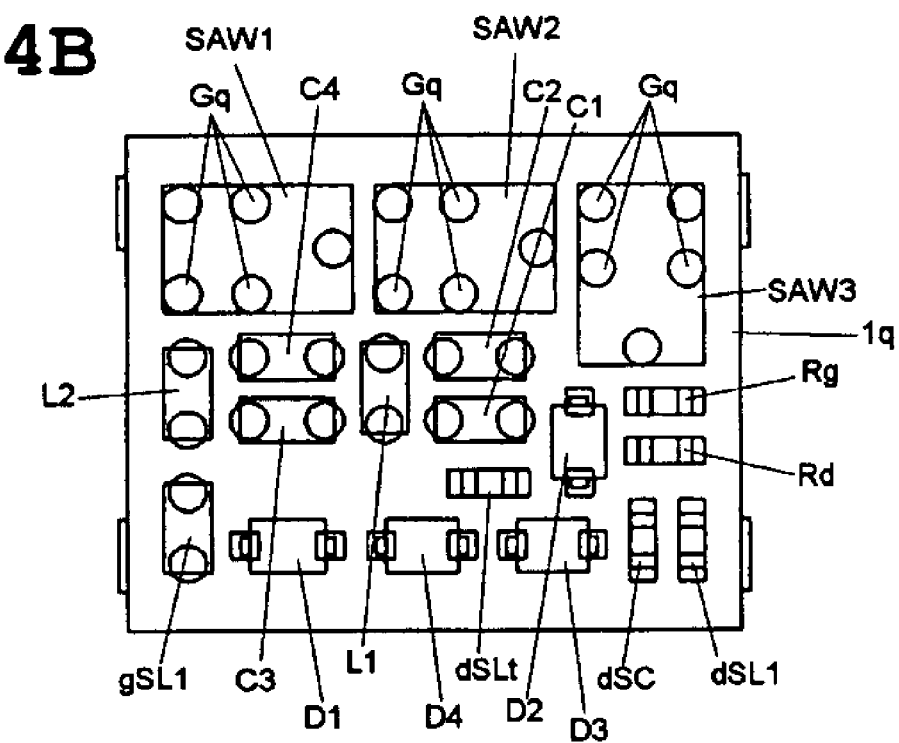

Referring to FIGS. 2A to 4B, the multilayer substrate of the RF front-end module includes dielectric layers 1a to 1q. More specifically, the dielectric layer 1a shown in FIG. 2A is a lowermost dielectric layer, and the dielectric layer 1q shown in FIG. 4B is an uppermost dielectric layer. FIGS. 2A to 4B show the dielectric layers 1a to 1q as viewed from lower surfaces thereof (from surfaces facing a mounting substrate).

In the lowermost dielectric layer 1a, various external terminals (ground terminals G, PCS-reception-signal output terminal PCSRx, DCS-reception-signal output terminal DCSRx, GSM-reception-signal output terminal GSMRx, control terminals (switch-control-signal input terminals) Vc1 and Vc2, DCS/PCS-transmission-signal input terminal D/PTx, GSM-transmission-signal input terminal GSMTx, and antenna terminal Ant).

Now, electrodes patterns in the dielectric layers will be described. Referring to FIGS. 2A to 2H, in the dielectric layer 1b, a second ground electrode Gb that functions as a common ground electrode is formed. In the dielectric layer 1c, capacitor electrodes gC5, dC5, Ct1, Ct2, and Cu5 are formed.

In the dielectric layer 1d, a second ground electrode Gd that functions as a common ground electrode, and a capacitor electrode Ct5 are formed.

In the dielectric layer 1e, capacitor electrodes Cc1, Cu1, and Cu2 are formed at particular regions, respectively.

In the dielectric layer 1f, capacitor electrodes Cc1 and Ct3 are formed at particular regions, respectively.

In the dielectric layer 1g, third ground electrodes Gg1, Gg2, and Gg3 that function as intermediate ground electrodes, and the capacitor electrode Cc1 are formed.

In the dielectric layer 1h, no particular electrode pattern is formed.

Referring next to FIGS. 3A to 3G, in the dielectric layer 1i, conductors Lt1, Lt2, Lt3, and Lt5 that serve as inductors, and a conductor dSL that serves as a transmission line are formed.

In each of the dielectric layers 1j and 1k, conductors Lt1, Lt2, Lt3, Lt4, Lt5 that serve as inductors, and the conductor dSL that serves as a transmission line are formed.

In the dielectric layer 1l, the conductors Lt2 and Lt4 that function as inductors are formed.

In the dielectric layer 1m, third ground electrodes Gm1, Gm2, and Gm3 that function as intermediate ground electrodes, and a capacitor electrode Cc2 are formed. In the dielectric layer 1n, the capacitor electrode Cc2 is formed. In the dielectric layer 1o, third ground electrodes Go1, Go2, and Go3 that function as intermediate ground electrodes, and the capacitor electrode Cc2 are formed.

Referring next to FIGS. 4A and 4B, in the dielectric layer 1p, conductors for interconnecting mounted chip components with each other, chip components and electrode patterns in the multilayer substrate, and electrode patterns in the multilayer substrate with each other, are provided.

In the dielectric layer 1q at the uppermost layer, mounting electrodes for mounting various components are formed. The dielectric layer 1q is shown in perspective as viewed from a lower surface of the dielectric layer 1q. On the dielectric layer 1q (that is, on a first principal surface of the multilayer substrate of the RF front-end module), SAW filters SAW1, SAW2, and SAW3 are mounted as high-frequency components. Furthermore, inductive components (chip inductors) gSL1, dSLt, dSL1, L1, and L2, capacitive components (chip capacitors) dSC, C1, C2, C3, and C4, resistive components (chip resistors) Rg and Rd, and diodes (chip diodes) D1, D2, D3, and D4 are mounted as shown.

In the areas where the SAW filters are mounted, three first ground electrodes Gq are preferably provided for each of the SAW filters. Other electrodes in the areas where the SAW filters are mounted are electrodes that define inputs and outputs of the SAW filters.

In FIGS. 2A to 4B, via-hole conductors indicated by a large number of small circles in the figures are formed in the dielectric layers, and electrodes (conductors) adjacent to each other in a direction of lamination of the dielectric layers are connected to each other by way of the via-hole conductors.

As shown in FIGS. 2A to 4B, in the high-frequency module according to this preferred embodiment, the third ground electrodes Gg, Gm, and Go that function as intermediate ground electrodes are provided in three layers between the second ground electrode Gd and the first ground electrodes Gq. The ground terminals of the SAW filters SAW1, SAW2, and SAW3 are connected to the second ground electrode Gd by way of a larger number of (four, in this example) via-hole conductors than the number of ground terminals of the SAW filters SAW1, SAW2, and SAW3 (three in this example). Thus, the SAW filters are grounded to the second ground electrode at low inductances. Furthermore, the intermediate ground electrodes Gg1, Gg2, Gg3, Gm1, Gm2, Gm3, Go1, Go2, and Go3 are separated among the SAW filters SAW1, SAW2, and SAW3. Thus, diffraction of signals by way of the intermediate electrodes is prevented.

In the example described above, the third ground electrodes at an uppermost layer among the plurality of layers where the third ground electrodes are formed is provided with a larger number of via-holes conductors than the number of first ground electrodes. Alternatively, the intermediate ground electrodes at the uppermost layer may be provided with the same number of via-hole conductors as the number of first ground electrodes while providing intermediate ground electrodes at a lower layer with a larger number of via-hole conductors than the number of the first ground electrodes.

In the example described above, intermediate electrodes are preferably provided separately for each of the three high-frequency components, i.e., the SAW filters SAW1, SAW2, and SAW3. However, the present invention is not limited to an arrangement where third ground electrodes that function as intermediate electrodes are provided individually for all the high-frequency components. It suffices that at least two high frequency components are provided with intermediate electrodes separately associated therewith. In relation to the example described above, the arrangement may be such that the SAW filters SAW1 and SAW2 are associated with a common intermediate electrode (third ground electrode) and the SAW filter SAW3 is associated with a separate intermediate electrode (third ground electrode).

Figure 5:
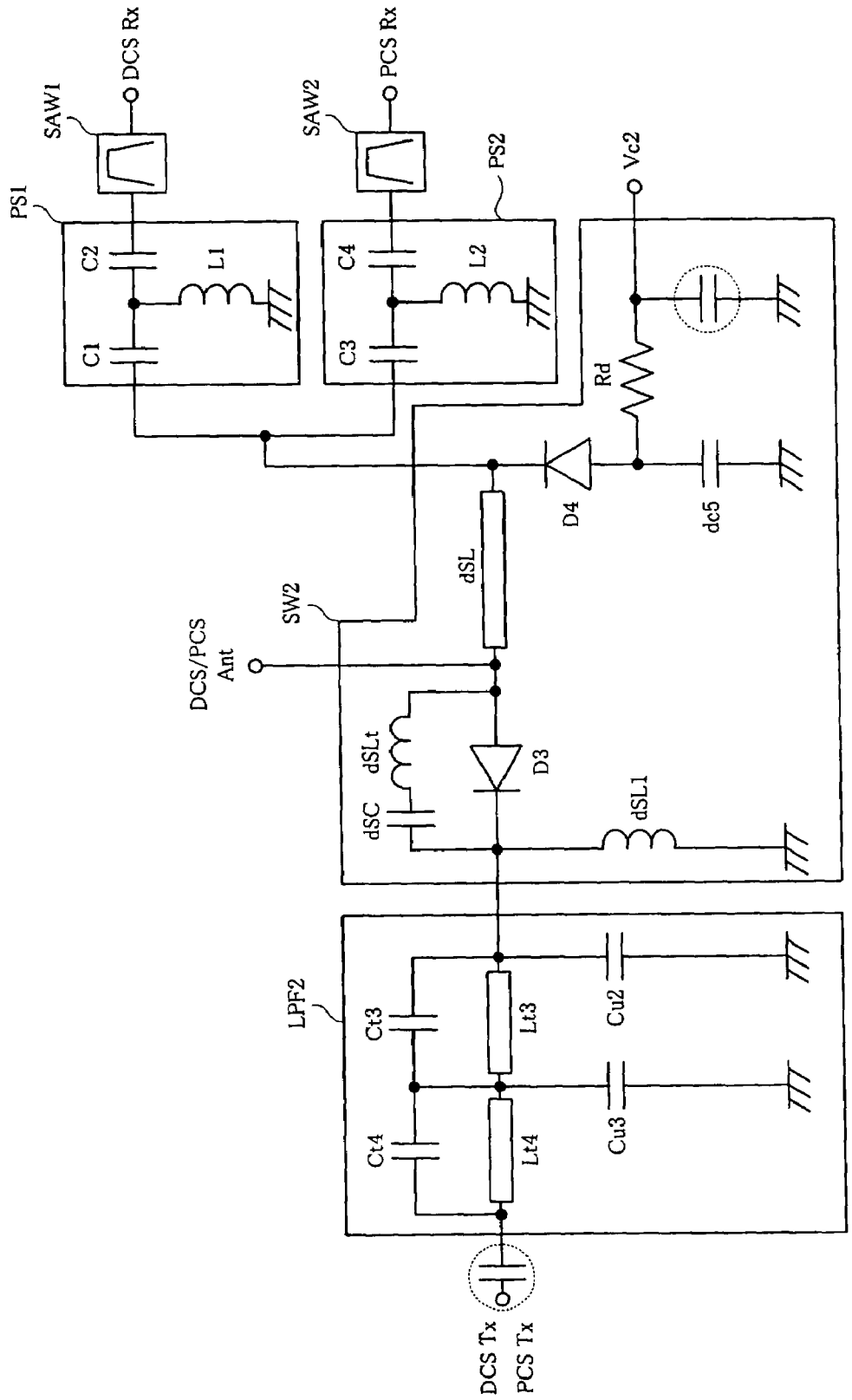
FIG. 5 is a partial circuit diagram of a front end according to a preferred embodiment of the present invention.
Figure 6:
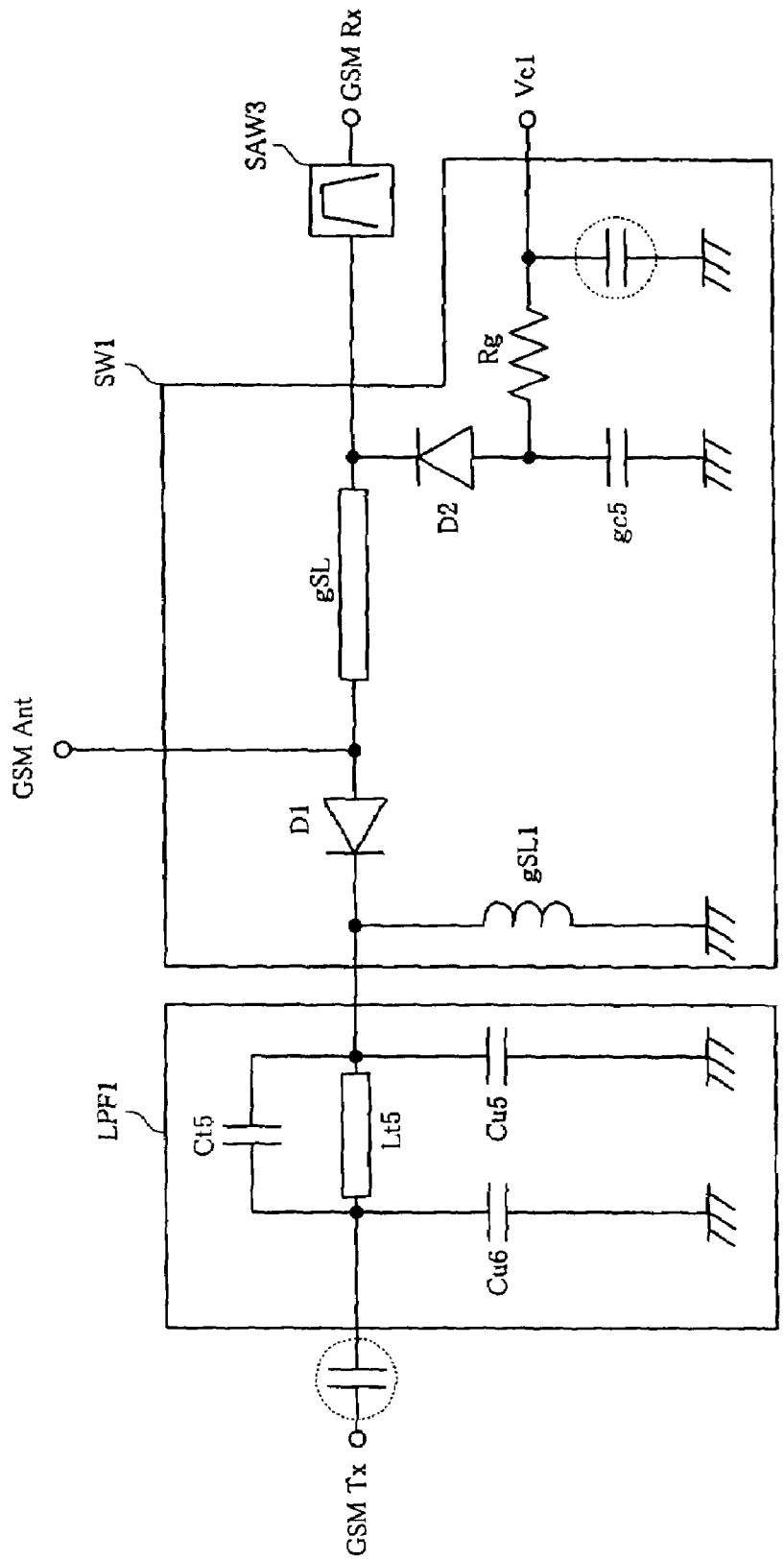
FIG. 6 is a partial circuit diagram of the front end according to a preferred embodiment of the present invention.
Figure 7:
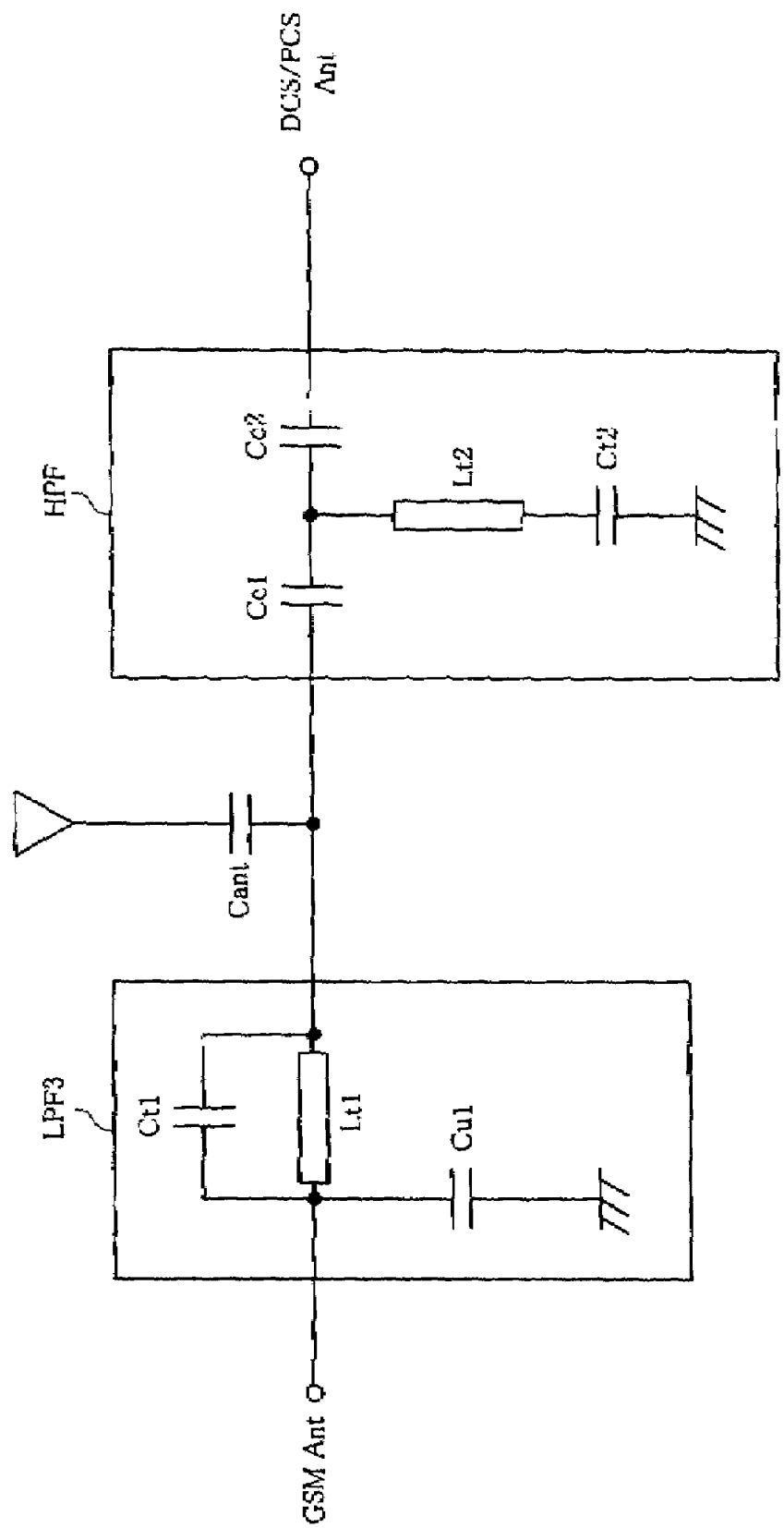
FIG. 7 is a partial circuit diagram of the front end according to a preferred embodiment of the present invention.
Figure 8:
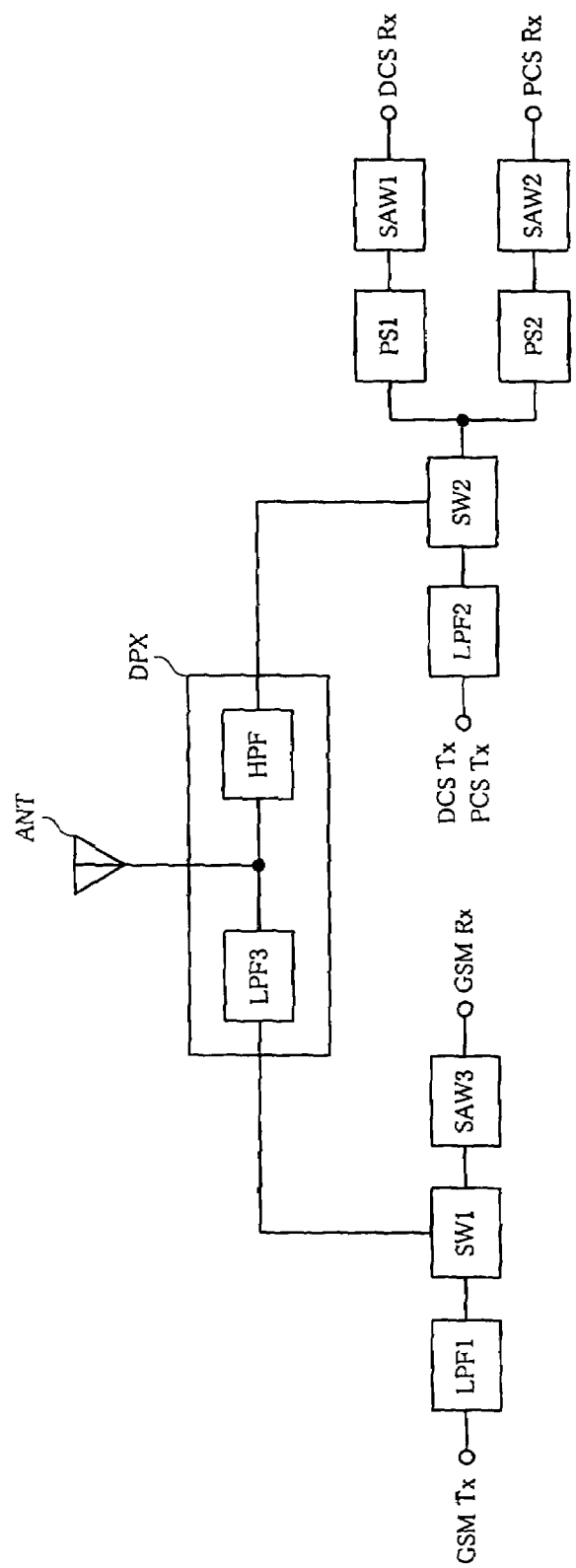
FIG. 8 is a partial circuit diagram of the front end according to a preferred embodiment of the present invention.

FIGS. 5 to 8 show equivalent circuit diagrams of the high-frequency module shown in FIGS. 2A to 4B. Reference numerals used in FIGS. 5 to 8 correspond to those used in FIGS. 2A to 4B. FIG. 5 is an equivalent circuit diagram of a filter section and a high-frequency switch section for DCS/PCS. FIG. 6 is an equivalent circuit diagram of a filter section and a high-frequency switch section for GSM. FIG. 7 is an equivalent circuit diagram of a diplexer section. FIG. 8 is an overall block diagram of the above-described elements. In these figures, elements shown as enclosed in dashed circles are elements mounted on a surface of the multilayer substrate.

Referring to FIG. 5, a circuit denoted by LPF2 is a low-pass filter for attenuating harmonic components of DCS/PCS transmission signals, and a circuit denoted by SW2 is a switch circuit for switching between a transmission signal and a reception signal. When the switch-control signal Vc2 is at a high level, the diodes D3 and D4 both turn on, so that a transmission signal is output to a terminal DCS/PCSAnt. When the switch-control signal Vc2 is at a low level, the diodes D3 and D4 both turn off, so that a reception signal is fed to phase-shift circuits PS1 and PS2.

The SAW filter SAW1 transmits DCS reception signals, and the SAW filter SAW2 transmits PCS reception signals. The phase-shift circuit PS1 rotates a phase in a passband of the SAW filter SAW2 to an open side on a Smith chart. The phase-shift circuit PS2 rotates a phase in a passband of the SAW filter SAW1 to an open side on a Smith chart. Thus, diffraction of reception signals between DCS and PCS is prevented.

Referring to FIG. 6, a circuit denoted by LPF1 is a low-pass filter for attenuating harmonic components of GSM transmission signals. In a switch circuit SW1, when the switch-control signal Vc1 is at a high level, the diodes D1 and D2 both turn on, so that a transmission signal is output to a terminal GSMAnt. When the switch-control signal Vc1 is at a low level, the diodes D1 and D2 both turn off, so that a reception signal is output from the terminal GSMRx through the SAW filter SAW3.

Referring to FIG. 7, a circuit denoted by LPF3 is a low-pass filter that transmits GSM signals, and a circuit denoted by HPF is a high-pass filter that transmits DCS/PCS signals.

The triple-band front end shown in FIG. 8 is configured as described above.

Figure 9:
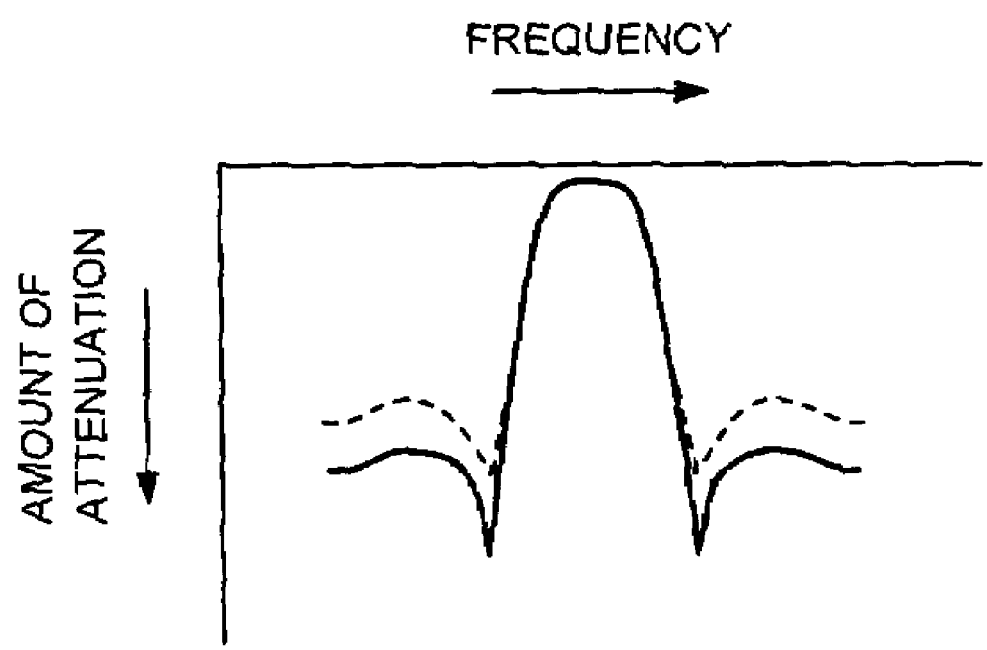
FIG. 9 is a diagram schematically showing transmission characteristics of a SAW filter in the vicinity of passband frequencies thereof.

FIG. 9 schematically shows transmission characteristics of one representative SAW filter among the three SAW filters SAW1, SAW2, and SAW3, in the vicinity of passband frequencies thereof. In FIG. 9, a solid line represents transmission characteristics according to this preferred embodiment, and a dashed line represents transmission characteristics in a case where the intermediate ground electrodes are not provided.

As described above, for grounding high-frequency components mounted on an upper-surface of a multilayer substrate, between first ground electrodes and a second ground electrode, third ground electrodes that function as intermediate ground electrodes are provided. Thus, a large amount of attenuation is achieved in an attenuation band.

Figure 10:
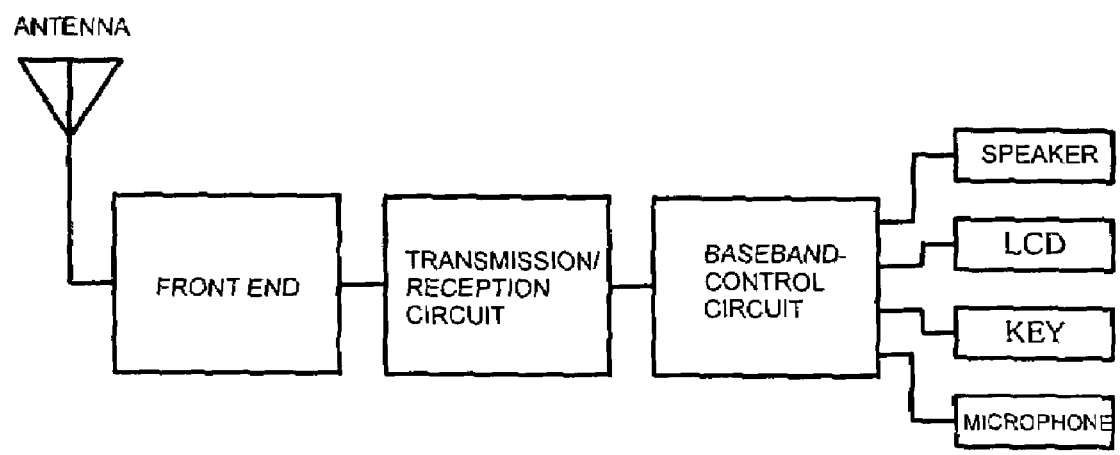
FIG. 10 is a diagram showing an example configuration of a communication apparatus according to a preferred embodiment of the present invention.
Figure 11A:
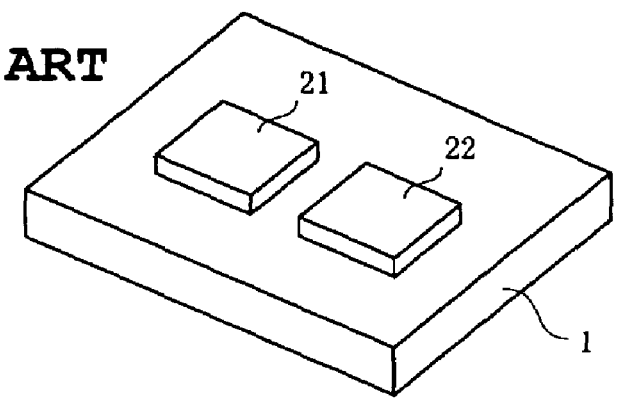
FIGS. 11A and 11B are an external perspective view and an exploded perspective view, respectively, of a high-frequency module according the related art.
Figure 11B:
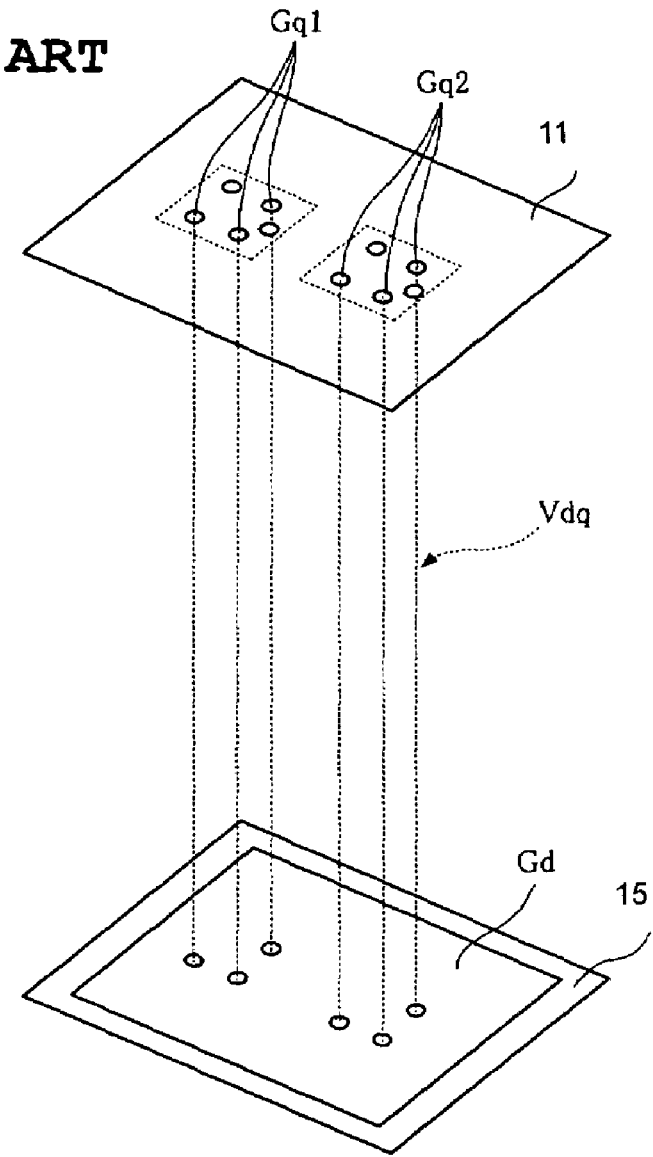

FIG. 10 is a block diagram showing an example configuration of a communication apparatus according to a preferred embodiment of the present invention. Referring to the figure, a "front-end" section is implemented by the triple-band front end shown in FIGS. 2A to 8. A "transmission/reception circuit" functions as the triple-band transmission circuit and reception circuit described earlier. A "baseband-control circuit" is used to control the transmission/reception circuit, to read input operations of a key-input unit KEY, to drive a display LCD, for audio input from a microphone, to drive a speaker, etc.

As described above, the communication apparatus, including the front-end section that achieves a large amount of attenuation in an attenuation band, exhibits stable and favorable communication performance.

The present invention is not limited to each of the above-described preferred embodiments, and various modifications are possible within the range described in the claims. An embodiment obtained by appropriately combining technical features disclosed in each of the different preferred embodiments is included in the technical scope of the present invention.

What is claimed is:

1. A high-frequency module comprising:
   a multilayer substrate including a plurality of dielectric layers and a plurality of internal electrode layers laminated together, the multilayer substrate having at least one first ground electrode on a first principal surface thereof and having a second ground electrode on a second principal surface thereof or inside thereof; and
   a high-frequency component mounted on the first principal surface of the multilayer substrate, the high-frequency component having at least one ground terminal connected to the first ground electrode of the multilayer substrate;
   wherein a third ground electrode is provided inside the multilayer substrate, the third ground electrode being connected to the first ground electrode by way of a via-hole conductor and connected to the second ground electrode by way of a plurality of via-hole conductors.

2. A high-frequency module according to claim 1, wherein the third ground electrode includes a plurality of layers of third ground electrodes, the third ground electrodes being connected to each other by way of a plurality of via-hole conductors.

3. A high-frequency module according to claim 1, wherein the high-frequency component has a plurality of ground terminals, the multilayer substrate has a plurality of first ground electrodes respectively associated with the plurality of ground terminals, the plurality of first ground electrodes being connected to a common third ground electrode by way of a plurality of via-hole conductors respectively associated with the plurality of first ground electrodes.

4. A high-frequency module according to claim 1, wherein a plurality of high-frequency components is mounted on the first principal surface of the multilayer substrate, and a plurality of third ground electrodes respectively associated with the plurality of high-frequency components is provided.

5. A high-frequency module according to claim 4, wherein each of the plurality of high-frequency components has a plurality of ground terminals, the multilayer substrate has a plurality of first ground electrodes respectively associated with the plurality of ground terminals of the plurality of high-frequency components, and the plurality of first ground electrodes is connected to a common third ground electrode by way of a plurality of via-hole conductors respectively associated with the plurality of first ground electrodes.

6. A high-frequency module according to claim 1, wherein the number of via-hole conductors connecting the third ground electrode to the second ground electrode is larger than the number of via-hole conductors connecting the first ground electrode to the third ground electrode.

7. A high-frequency module according to claim 1, wherein an inductance component of via-hole conductors connecting the first ground electrode to the third ground electrode is smaller than an inductance component of the via-hole conductors connecting the third ground electrode to the second ground electrode.

8. A high-frequency module according to claim 1, wherein the third ground defines an intermediate ground electrode.

9. A high-frequency module according to claim 1, wherein a plurality of third ground electrodes are provided inside of the multilayer substrate between the first and second ground electrodes.

10. A high-frequency module according to claim 1, wherein a plurality of surface acoustic wave filters is mounted on the first principal surface of the multilayer substrate.

11. A high-frequency module according to claim 10, wherein a plurality of third ground electrodes are provided for the plurality of surface acoustic wave filters.

12. A high-frequency module according to claim 11, wherein the plurality of third ground electrodes are intermediate electrodes.

13. A communication apparatus comprising a high-frequency module according to claim 1, the high-frequency module being provided in a front-end section, wherein the high-frequency component is a chip filter, and an LC filter is disposed inside the multilayer substrate.

14. A communication apparatus according to claim 13, wherein the front-end section is a triple-band front end section.

15. A communication apparatus according to claim 13, further comprising a transmission/reception circuit.

16. A communication apparatus according to claim 13, further comprising a baseband control circuit.

* * * * *